United States Patent [19]

Ohkuma

[11] Patent Number: 5,380,684
[45] Date of Patent: Jan. 10, 1995

[54] METHOD FOR TRANSFERRING WAFERS FROM ONE PROCESSING STATION TO ANOTHER SEQUENTIALLY AND SYSTEM THEREFOR

[75] Inventor: Yuji Ohkuma, Kawasaki, Japan

[73] Assignee: Fujitsu Limited, Kawasaki, Japan

[21] Appl. No.: 115,768

[22] Filed: Sep. 3, 1993

[30] Foreign Application Priority Data

Sep. 8, 1992 [JP] Japan .................. 4-238730

[51] Int. Cl.$^6$ ............................. H01L 21/00
[52] U.S. Cl. ..................... 437/250; 29/25.01;
414/225; 414/935; 118/500
[58] Field of Search ............ 437/250; 29/25.01;
414/222, 225, 749, 751, 753, 935, 941; 118/500

[56] References Cited

U.S. PATENT DOCUMENTS

| | | | |
|---|---|---|---|
| 4,923,352 | 5/1990 | Tamura et al. | 414/225 |
| 5,030,057 | 7/1991 | Nishi et al. | 118/500 |
| 5,110,248 | 5/1992 | Asano et al. | 414/753 |
| 5,178,638 | 1/1993 | Kaneko et al. | 29/25.01 |
| 5,232,505 | 8/1993 | Novak et al. | 118/500 |
| 5,278,104 | 1/1994 | Kodera et al. | 437/250 |
| 5,297,910 | 3/1994 | Yoshioka et al. | 414/751 |
| 5,310,442 | 5/1994 | Ametani | 29/25.01 |

*Primary Examiner*—Brian E. Hearn
*Assistant Examiner*—Kevin M. Picardat
*Attorney, Agent, or Firm*—Staas & Halsey

[57] ABSTRACT

A method for transferring wafers from one processing station to another station sequentially, utilizing a transfer system which is installed in a clean bench forming a downward flow of clean air. A plurality of stations is provided for processing wafers in the clean bench. The transfer system comprises at least a single transfer robot carrying a plurality of wafers, the transfer robot being movable from one station to another sequentially for processing, and an exhaust duct is provided along a path of the transfer robot movement, the duct having a plurality of inlets for exhausting the air. The method of the invention comprises (a) providing partition walls for each of the transfer robots, the walls surrounding the plurality of wafers and defining an air flow chamber and an air filter arranged on the top of the chamber, thereby forming a downward air flow in the surrounding chamber, and (b) controlling a total amount of clean air supplied to the transfer system so as to be less than an air supply amount to the clean bench.

7 Claims, 3 Drawing Sheets

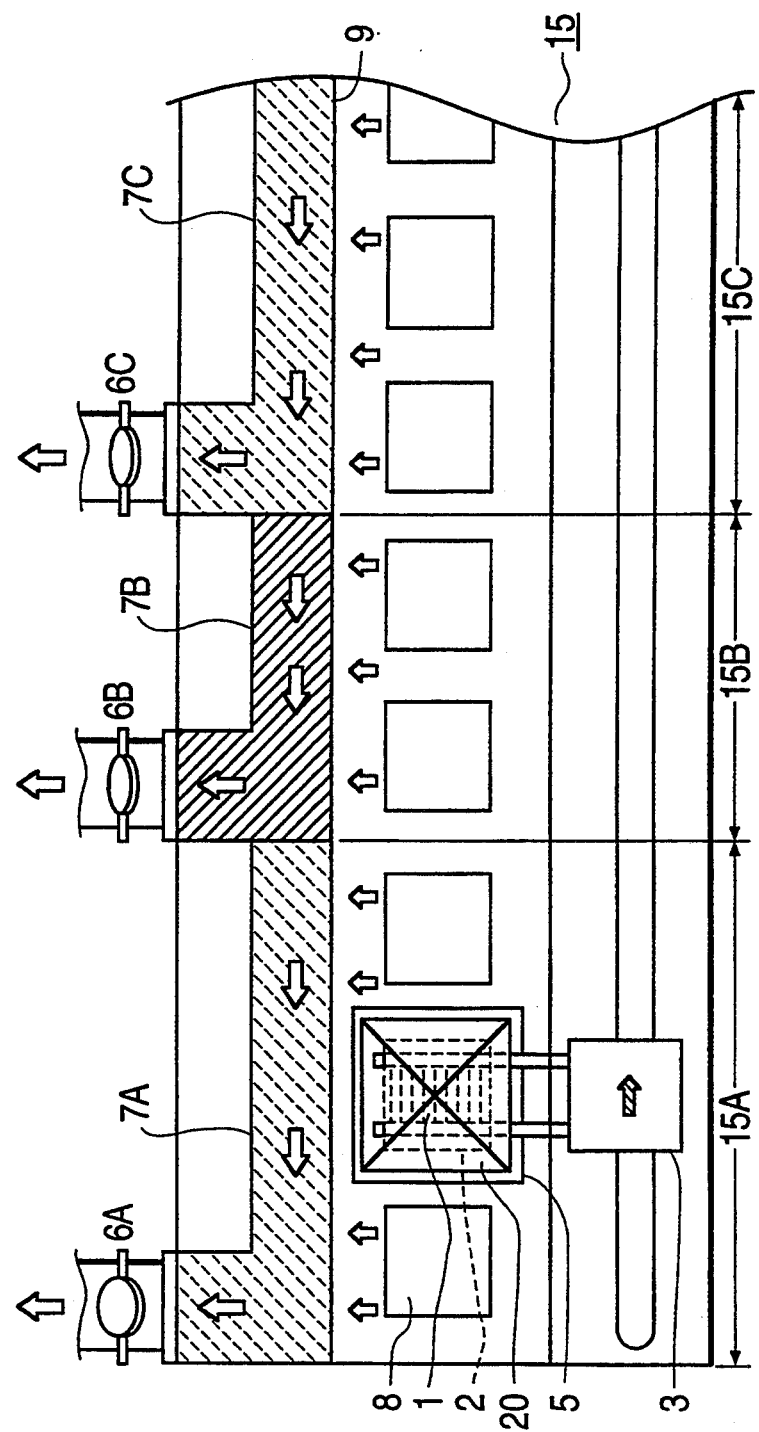

METHOD FOR TRANSFERRING WAFERS FROM ONE PROCESSING STATION TO ANOTHER SEQUENTIALLY AND SYSTEM THEREFOR

BACKGROUND OF THE INVENTION

1. Field of the Invention

The present invention relates to a method for transferring a batch of wafers from one station to another and to a wafer transfer system utilizing this method, wherein a plurality of wafers are automatically transferred from one processing station to another processing station sequentially, the wafers being processed at each station, and more particularly, to the method by which an amount of clean air supplied to a clean room/bench may be reduced as much as possible. The wafer transfer system of the invention is useful when applied to chemical processing equipment which requires exhausting a lot of harmful gas or vapor produced during processing.

2. Description of the Related Art

It is well known that most semiconductor fabrication processes, particularly wafer processes, are performed in a clean room. Further, in order to enhance local cleanliness of the air on a work bench and to exhaust any harmful gas or vapor thereby produced, a clean bench system is often utilized in the clean room.

An exemplary existing wafer transfer system applied for a wet-processing equipment is first described, wherein the wet-processing equipment as a whole forms a clean bench. With a trend toward an increasing amount of wafers for processing, the wet-processing equipment becomes more large-sized, which requires an increased amount of exhaust gas.

FIGS. 1(a) and 1(b) show schematically a front and a side view of a wet-processing equipment 15 of the prior art, the equipment itself forming a clean bench.

A plurality of semiconductor wafers 1 are vertically held in a carrier 2, and the carrier is suspended by a hanger 30. A transfer robot 3 having a horizontal arm 31 supports the hanger 30. The transfer robot 3 together with a center rode 33 can move up-and-down by a mechanism (not shown) housed in a box 35, and further the transfer robot 3 can move in a horizontal direction from left to right as shown in FIG. 1(a) by a transfer mechanism (not shown). Chemical solutions or water 18 are contained in baths 8, each of which has a respective automatic cover 12. When the carrier 2 with wafers 1 moves to a position of each bath, the cover 12 is opened and the wafers are lowered through the opened cover and dipped in the chemical solution or the water 18 for chemical treatment or washing.

The entire processing equipment 15 is installed in a clean room, in which a downward flow of clean air is produced as shown by arrows 39. Air filter 16 of HEPA (High Efficiency Particulate Air-filter) and fan 37 are provided on the top of the equipment 15. The clean air 39 in the clean room in inhaled and spouted out from the air filter 16 and forms a downward air flow 38 in the equipment 15. Gas and/or vapor, briefly called hereinafter chemical vapor 19, produced during the process flows into an exhaust opening 9 and is exhausted through an exhaust duct 7.

The wet-processing equipments presently used have a clean bench type structure as described above, and clean air spouted out from the air filter 16, which occupies nearly ⅔ of a floor space of the equipment, is almost exhausted out of the clean bench. In order to maintain the downward air flow 38 in the equipment 15 and to confine the chemical vapor produced during the processing and transport steps into a limited space, the air flow from the filter 16 on the top of the equipment 15 is required to have a flow velocity substantially equal to or larger than about 0.3–0.4 m/sec.

To maintain high air velocity in the clean bench system of the equipment 15, requires a large amount of the clean air supplied to the clean room itself, and further an amount of the exhaust air which is to be treated and thereafter abandoned becomes large. These factors increase a running cots of the clean room having the wet-processing equipment 15.

In order to enhance cleanliness of limited ambient air around wafers, a wafer carrier integrated with a filter and a fan is known; however, this type of wafer carrier takes no thought of a clean air supply to the clean room.

Further, Japanese Laid-Open Patents SHO-63-248449 and HEI 2-277556 disclose wet-processing equipment, wherein chemical vapor is prevented from diffusing into the clean room/bench by utilizing a horizontal air curtain above a chemical processing bath. The method also does not take saving or conservation of the clean air supply to the clean room into consideration.

SUMMARY OF THE INVENTION

An object of the present invention is to provide a method for transferring a carrier containing wafers from one station to another station sequentially for processing, thereby reducing a total supply of clean air to a clean room as much as possible.

Another object of the present invention is to provide a wafer transfer system installed in a clean room, wherein the system will reduce consumption of clean air needed for the clean room as much as possible.

Still another object of the present invention is to provide a wafer wet-processing equipment installed in a clean room, wherein the wafer transfer and exhaust system of the present invention is utilized, thereby to reduce the total amount of the clean air supplied to a clean room.

These objects can be achieved by a wafer transfer method and a wafer transfer system of the present invention. The transfer system is installed in a clean bench forming a downward flow of clean air, a plurality of stations are provided for processing wafers in the clean bench, and the transfer system comprises at least a single transfer robot carrying a plurality of wafers, the transfer robot being movable from one processing station to another sequentially for processing, and an exhaust duct which is provided along a transfer path of the transfer robot, the duct having a plurality of inlets for exhausting air.

The method of the invention comprises: (a) providing partition walls for the transfer robot, the walls surrounding a limited space including the plurality of wafers, and an air filter arranged on the top of the surrounding wall, thereby forming a downward air flow in the surrounding wall, and (b) controlling a total amount of clean air supplied to the surrounding wall so as to be less than an amount of air supply to the clean bench, thereby the exhaust capacity needed for each surrounding wall can be maintained enough for removing the harmful gas out of the clean bench.

BRIEF DESCRIPTION OF THE DRAWINGS

FIG. 3 shows schematically a top view of the wafer transfer system of FIGS. 2(a) and 2(b) of the present invention, in which exhaust air flow in the equipment is illustrated.

Throughout the drawings, the same reference numerals designate and identify the same or similar parts.

DETAILED DESCRIPTION OF THE PREFERRED EMBODIMENTS

Figure 1A:
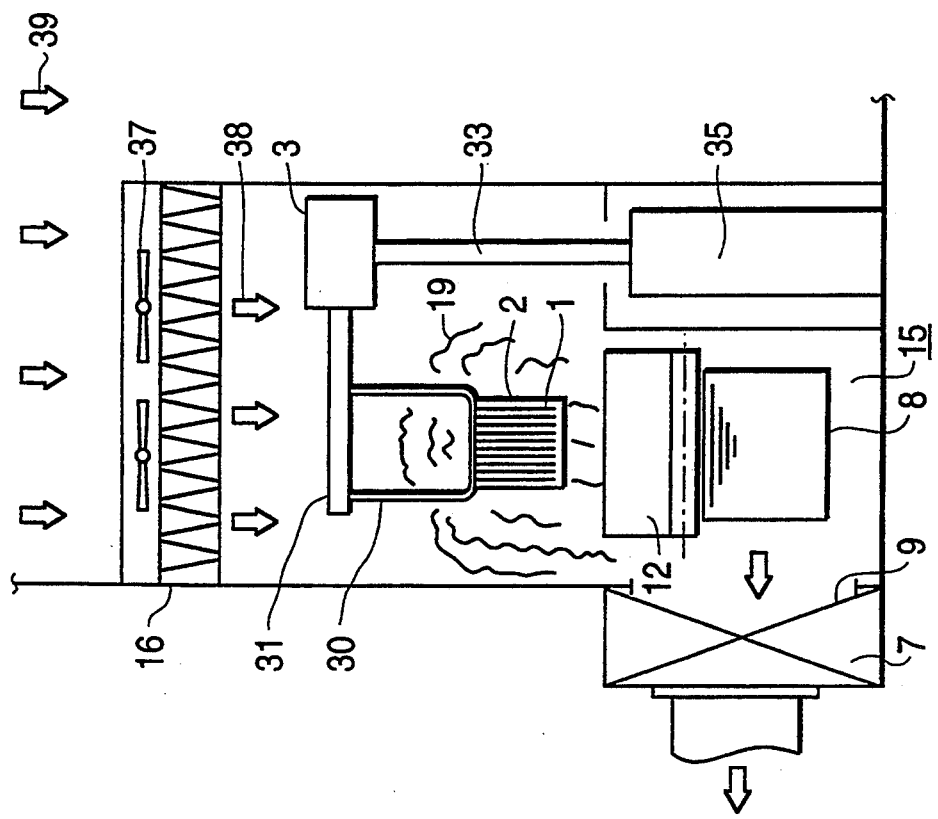
FIGS. 1(a) and 1(b) show respectively a front and a side view of the prior art wafer transfer system applied for a wet-processing equipment.
Figure 1B:
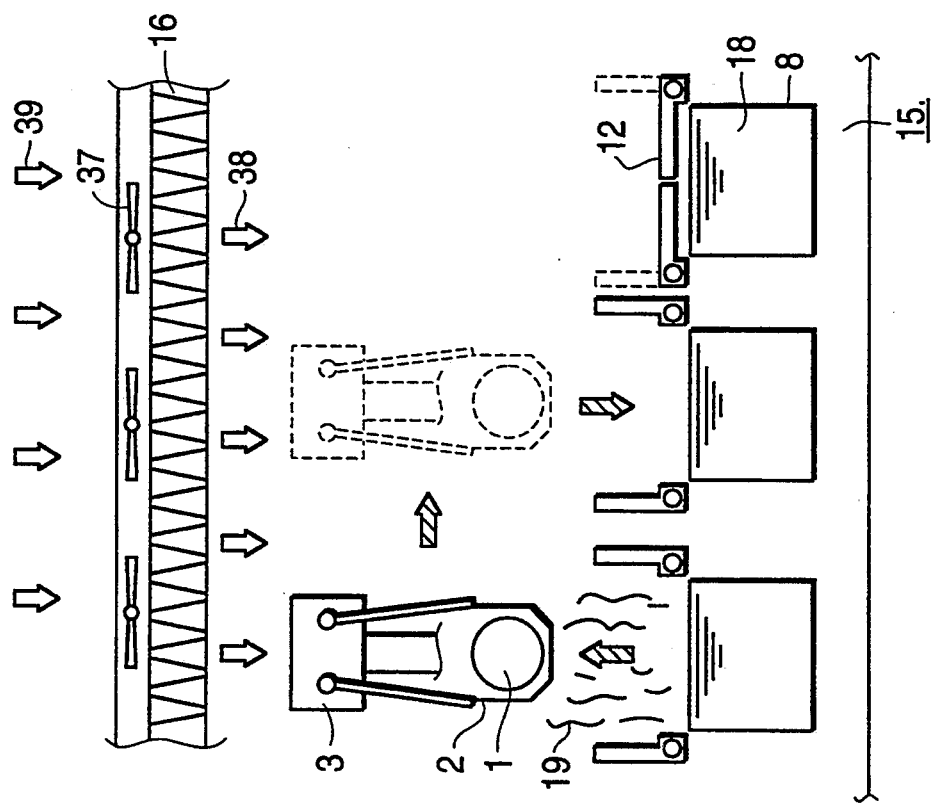
Figure 2B:
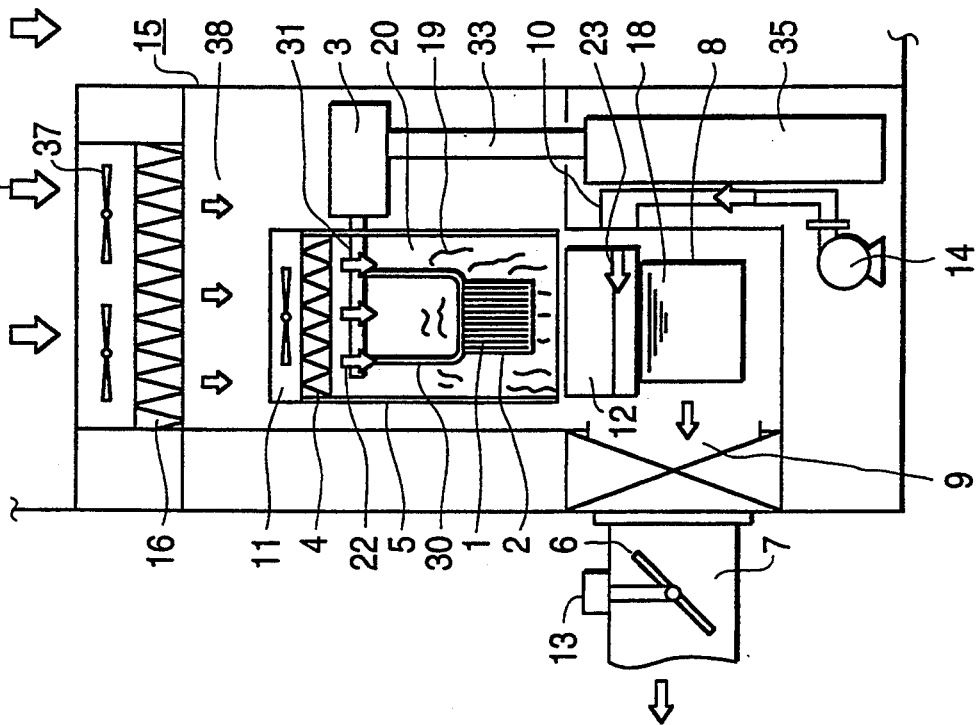
FIGS. 2(a) and 2(b) show respectively a front and a side view of a wafer transfer system applied for a wet-processing equipment in accordance with the present invention.
Figure 2A:
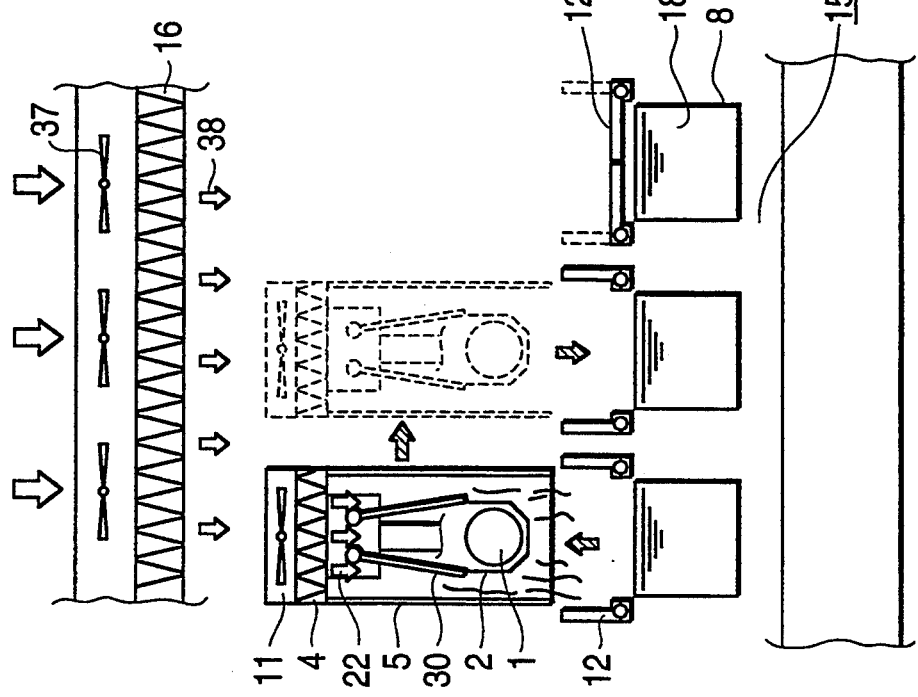

FIG. 2(a) shows schematically a front view of an embodiment of a wafer transfer system applied for a wet-processing equipment in accordance with the present invention, and FIG. 2(b) shows a side view thereof. The embodiment of wafer transfer system shown in FIGS. 2(a) and 2(b) has special features which are different from the prior art system of FIGS. 1(a) and 1(b), and these features are first described in the following.

Partition walls 5 on four sides form an enclosure 20 which surrounds a carrier 2 holding a plurality of wafers 1, a hanger 30 and an arm 31. On the top of the enclosure 20, an air filter 4 of HEPA and a fan unit 11 are independently attached to each transfer robot 3 forming a downward air flow 22, and the partition walls 5, the air filter 4, and the fan unit 11 move with movement of a transfer robot 3. An air duct is divided into a plurality of sections, and an exhaust duct 7 of each of the sections is provided with an air flow damper 6, and the air flow damper 6 is opened or closed by a damper control unit 13 and controls an exhaust air flow therethrough for the section. Each section of the exhaust duct 7 takes charge of, i.e., controls, exhausting air and/or vapor for two to three processing stations.

An air blow outlet 10 is provided on the right side of the bath 8 in FIG. 2 (b) and at a height to form a horizontal air curtain 23 on the bath 8. The air blow outlet 10 is arranged on the opposite side of an air inlet 9 to a duct 7 for the bath 8. A fan 14 is separately provided for supplying clean air to the air blow outlets 10.

Other structures are substantially similar to those described in the structure of FIGS. 1(a) and 1(b). The transfer robot 3 can move up-and-down with a center rod 33 by a mechanism comprised in a box 35, and further the transfer robot 3 can move from left to right in a horizontal direction in FIG. 2(a) by a transfer mechanism. Chemical solution of water 18 is contained in baths 8 which have respective automatic covers 12. When the carrier 2 with wafers 1 moves to a position of each bath, the cover 12 is opened and the wafers are lowered through the opened cover and dipped into chemical solution or water 18 for chemical processing or washing. Clean air spouts out from air filter 16 of HEPA installed at the top of the equipment 15. The clean air 39 in the clean room is supplied to the filter 16 by a fan 37 located on the filter 16.

In FIGS. 2(a) and 2(b), a velocity of air flow 38 from air filter 16 needed for the clean bench system 15 can be reduced to about 0.1 m/sec which is almost $\frac{1}{3}-\frac{1}{4}$ of the velocity used in the prior art equipment. This reduction in air velocity can be achieved by partitioning the processing region into a small space by the walls 5 which form the enclosure 20 and, on the other hand, a velocity of air flow 22 in the enclosure 20 is increased by providing the air filter 4 and the fan unit 11. In the embodiment, the velocity of air flow 22 from the air filter 4 is set up at about 0.4 m/sec. Chemical vapor produced while the wafers 1 are dipped in the bath 8 is completely confined in the enclosure 20 of the walls 5. When the carrier 2 with wafers 1 is raised, chemical vapor escaping from the bottom opening of the enclosure 20 and coming up from the bath 8 is interrupted by the air curtain 23 and expelled toward the inlet 9 of duct 7.

Further, while the carrier 2 with wafers 1 is transported from one processing bath to another processing bath, the chemical vapor is restricted in the enclosure 20 and the air flow path toward the duct 7, and does not diffuse into the other portions of the equipment. Through the entire steps, the chemical vapor is prevented from diffusing into other portions of the processing equipment 15.

FIG. 3 shows a schematic top view of the embodiment of the wafer transfer system of FIGS. 2(a) and 2(b). FIG. 3 shows mainly an exhaust system associated with the wet-processing equipment for the purpose of explaining air flow in the equipment.

In FIG. 3, the equipment 15 is divided into several sections 15A, 15B, and 15C with respective ducts 7A–7C having corresponding air flow dampers 6A–6C. This does not mean that each duct is separated from each other, but the exhaust air from one section may flow into another section and may be exhausted therefrom. When the transfer robot 3 is positioned in the section 15A, the air flow damper 6A is opened automatically for increasing an exhaust capacity for the section 15A. This is because the transfer robot 3 in this section 15A spouts out a large amount of air from the enclosure 20 in which the air filter 4 with the fan unit 11 are provided, which requires an increased amount of exhaust air for this section. The increment of the exhaust air corresponds almost to the air amount spouted out from the air filter 4 by the fan unit 11. On the other hand, because there is no transfer robot in the sections 15B and 15C, the air flow dampers 6B, 6C are almost closed so as to reduce the air amount flowing therethrough to a level which corresponds substantially to the air amount of each section spouted out from the air filter 16 on the top of the equipment 15.

When the transfer robot 3 goes out of the section 15A and enters into the section 15B, the air flow damper 6B is opened to increase the exhaust air amount from the section 15B, and the air flow damper 6A is substantially closed to restore the exhaust level for the section 15A to the condition without the transfer robot.

In accordance with the present invention, the clean air supply to the clean bench forming the wet-processing equipment 15 can be remarkably reduced. The exhaust capacity needed for each of transfer robots 3 can be maintained to be enough for removing the harmful gas out of the clean bench, however, an air amount needed for all the transfer robots 3 forming the transfer system can be reduced. The total supply of clean air to the clean bench, through it is reduced from the amount of the prior art method, can be still greater than the total amount of clean air flowing through enclosure 20 for the transfer robots 3. In the prior art wet-processing equipment, substantially all clean air supply to the equipment should be exhausted out of the clean bench in order to remove the harmful gas produced at each processing station. On the contrary, it is enough to exhaust the harmful gas produced in each enclosure 20 for the transfer robot in the embodiment.

When the wafer transfer system of the present invention is applied to the wet-processing equipment of the clean bench type provided with an air filter 16 having dimensions such as 5×0.75 m, the exhaust air amount from the clean bench can be reduced to 2,500–3,500 m$^3$/hour which is a remarkable improvement from the prior art data of 4,100–5,400 m$^3$/hour. The air supply to the clean room where the equipment is installed can be also reduced.

When the transfer robot 3 finishes all transfer steps for processing, the carrier 2 is taken out from the robot. The transfer robot is made to return back to the initial position along a separate path (not shown), or transfer robots may be returned back along the same path. When one transfer robot 3 does not include the carrier 2 with wafers 1 and is mixed among the transfer robots with wafers on the path, the fan unit 11 attached to the one transfer robot is stopped, which results in further reducing the exhaust air amount.

In the embodiment, a plurality of wafers 1 are carried by the carrier 2, however, the transfer robot 3 of the invention may use a non-carrier hanger, wherein the plurality of wafers 1 may be suspended with the non-carrier hanger during the transfer step between the processing stations. In this case, the wafers are held by a holder disposed on the bottom of the bath 8 during chemical processing.

The presently disclosed embodiments are to be considered in all respects as illustrative and not restrictive, the scope of the invention being indicated by the appended claims, rather than the foregoing description, and all changes which come within the meaning and range of equivalence of the claims are, therefore, to be embraced therein.

What is claimed is:

1. A method for transferring wafers from one processing station to another processing station sequentially, utilizing a wafer transfer system which is installed in a clean bench forming a downward flow of clean air, wherein a plurality of stations for processing wafers is provided in the clean bench and the transfer system comprises at least a transfer robot which carries a plurality of wafers and is movable from one station to another station sequentially for processing and an exhaust duct which has at least an inlet for exhausting air, said method comprising the steps of:

providing partition walls for the transfer robots, the walls defining a chamber surrounding said plurality of wafers, an air filter and a fan positioned for producing a downward air flow in the chamber; and controlling a total amount of clean air supplied to the transfer system so as to be less than an air supply amount to the clean bench.

2. A method for transferring wafers as recited in claim 1, wherein an air velocity in said chamber is larger than an air velocity in the clean bench.

3. A method for transferring wafers as recited in claim 1, wherein said controlling step further comprises controlling an amount of exhaust air with movement of the transfer robot such that an exhaust air amount from a first inlet, to which the transfer robot is relatively closer, is larger than an exhaust air amount from a second inlet, to which transfer robot is relatively more distant.

4. A method for transferring wafers as recited in claim 3, wherein said duct for exhaust comprises a plurality of sections, each section comprising a damper for controlling air flow therethrough, and wherein said method of controlling the amount of exhaust air is performed by adjusting each of said dampers.

5. A method for transferring wafers as recited in claim 1, wherein an air blow outlet is provided with each of said processing stations, the air blow outlet blowing a horizontal air curtain above the processing station and toward the inlets of the duct.

6. A method for transferring wafers as reacted in claim 1, wherein said clean bench forming the downward air flow comprises an air filter installed on a top of the clean bench and blows the clean air downwardly.

7. A method for transferring wafers as reacted in claim 2, wherein said clean bench forming the downward air flow comprises an air filter installed on a top of the clean bench and blows the clean air downwardly.

* * * * *

UNITED STATES PATENT AND TRADEMARK OFFICE
CERTIFICATE OF CORRECTION

PATENT NO. : 5,380,684
DATED : Jan. 10, 1995
INVENTOR(S) : OHKUMA

It is certified that error appears in the above-indentified patent and that said Letters Patent is hereby corrected as shown below:

Col. 1, line 58, change "in" (second occurrence) to --is--.

Col. 2, line 12, change "cots" to --cost--;
line 23, after "saving" insert --,--; and after "conservation" insert --,--.

Signed and Sealed this

Fifteenth Day of August, 1995

*Attest:*

BRUCE LEHMAN

*Attesting Officer*  *Commissioner of Patents and Trademarks*